United States Patent [19]
Uenaka et al.

[11] Patent Number: 5,327,010
[45] Date of Patent: Jul. 5, 1994

[54] IC CARD HAVING ADHESION-PREVENTING SHEETS

[75] Inventors: Takeshi Uenaka, Sanda; Jun Ohbuchi, Itami; Shigeo Onoda, Itami; Makoto Omori, Itami; Hajime Maeda, Itami; Toru Tachikawa, Itami, all of Japan

[73] Assignees: Ryoden Kasei Co., Ltd., Hyogo; Mitsubishi Denki Kabushiki Kaisha, Tokyo, both of Japan

[21] Appl. No.: 553,459

[22] Filed: Jul. 17, 1990

[30] Foreign Application Priority Data

Sep. 9, 1989 [JP] Japan .................. 1-233476
Sep. 12, 1989 [JP] Japan .................. 1-236281

[51] Int. Cl.$^5$ ............... H01L 23/02; H01L 23/12; G06K 19/00
[52] U.S. Cl. .................. 257/679; 257/678; 257/687; 235/487; 235/488; 235/492; 174/52.4
[58] Field of Search ............... 357/74, 75, 80; 235/492, 488, 487, 491, 492; 257/678, 679, 680, 681, 685, 687; 174/52.4

[56] References Cited

U.S. PATENT DOCUMENTS 4,725,924  2/1988  Juan .................... 235/492
4,727,246  2/1988  Hara et al. ............ 235/492

FOREIGN PATENT DOCUMENTS 3626604  2/1987  Fed. Rep. of Germany .
6182285  4/1986  Japan .
2100669  6/1982  United Kingdom .

Primary Examiner—Sara W. Crane
Assistant Examiner—Carl Whitehead, Jr.
Attorney, Agent, or Firm—Leydig Voit & Mayer

[57] ABSTRACT

An IC card includes a substrate, semiconductor devices mounted on at least one of the major surfaces of the substrate and a casing in which the substrate with the semiconductor devices mounted on it is housed. The casing includes a frame and panels bonded to the frame on the opposite sides of the frame by means of adhesive layers. The semiconductor devices are prevented from being bonded to the panel via the adhesive layers at locations on the adhesive layers facing the semiconductor devices.

6 Claims, 4 Drawing Sheets

IC CARD HAVING ADHESION-PREVENTING SHEETS

This invention relates to an IC card, which comprises a substrate with semiconductor devices, such as IC's, mounted on it, a frame within which the substrate with the IC's is mounted, and panels bonded to the frame on its opposite sides to form a casing for housing the IC's.

BACKGROUND OF THE INVENTION

A conventional IC card of the above-described type is now described in detail with reference to FIGS. 1, 2 and 3.

FIG. 1 is a cross-sectional view of a conventional IC card 20, FIG. 2 is a perspective view of the conventional IC card inserted into an inlet port of an external device, and FIG. 3 is a cross-sectional view of the IC card of FIG. 1 when it is bent.

On opposing major surfaces of a substrate 13, lands 3a, 3b, . . . 3j are disposed. Each of the lands constitutes a part of the circuit of the IC card 20. Leads 2a, 2b, . . . , 2h of IC's 1a, 1b, . . . , 1h, which may be semiconductor devices for storing or processing information, are connected to the associated lands 3a, 3b, . . . , 3j by means of solder layers 4a, 4b, . . . , 4j. Thus, the IC's 1a, 1b, 1c, 1d, 1e, 1f, 1g and 1h are electrically and mechanically coupled to the respective opposing major surfaces of the substrate 13 by the leads 2a, 2b, 2c, 2d, 2e, 2f, 2g, 2h, 2i and 2h soldered to the associated lands 3a, 3b, 3c, 3d, 3e, 3f, 3g, 3h, 3i and 3h by means of the solder layers 4a, 4b, 4c, 4d, 4e, 4f, 4g, 4h, 4i and 4j. The substrate 13 on which the IC's 1a, 1b, . . . , 1h are mounted is disposed in a frame 5. A connector 6 is disposed at one end of the frame 5 for connecting the IC card 20 to an external device which is described later. The connector 6 is connected to the substrate 13 within the frame 5. A top panel 7 and a bottom panel 8 are bonded with respective adhesive layers 9a and 9b to the peripheral edges of the frame 5 on the opposite sides of the frame 5 to thereby form a casing, in which the substrate 13 with the IC's 1a-1h mounted thereon is housed. The IC's 1a, 1b, . . . 1h are bonded to the panels 7 and 8 with the adhesive layers 9a and 9b, respectively. The IC card 20 is inserted, by a user, into an external device 10 through an inlet port 10a thereof, as shown in FIG. 2, The insertion of the IC card 20 into the external device 10 causes the connector 6 of the IC card 20 to be connected to a connector (not shown) within the external device 10. When necessary processing has been completed, the IC card 20 is pulled out of the external device 10.

If the IC card 20 is roughly handled and receives abnormal force when, for example, it is inserted into or withdrawn from the external device 10, the IC card 20, particularly its rear part opposite to the end where the connector 6 is disposed, is bent in the direction perpendicular to the major surfaces of the card, as shown in FIG. 3. When the IC card 20 is bent in the clockwise direction as in the case shown in FIG. 3, not only the IC card 20 itself is deformed, but also the IC's 1a-1d, which are bonded to the top panel 7 via the adhesive layer 9a, are forced to move rearward due to the bending of the top panel 7. As for the IC's 1e-1h, which are bonded to the bottom panel 8 via the adhesive layer 9b, are forced to move forward toward the connector 6 of the IC card 20 due to the bending of the panel 8. When the IC's 1a-1d on the top surface of the substrate 13 move rearward and the IC's 1e-1h on the opposite surface of the substrate 13 move forward, force is exerted via the leads 2a-2h of the respective IC's to the associated solder layers 4a-4j. Since the amount of displacement of the rearmost IC's 1a and 1e is largest, the leads 2a and 2e of the IC's 1a and 1e are deformed more than the other leads. Accordingly, if the IC card 20 is repeatedly bent as it is inserted into the external device 10, the solder layers connected to the leads of the IC's, particularly the solder layers 4a, 4b, 4f and 4g to which the leads 2a and 2e of the IC's 1a and 1b located in the rear portion of the IC card 20 are connected, may be cracked, which may cause disconnection of the leads 2a and 2e from the associated lands 3a, 3b, 3f and 3g, or, sometimes the leads 2a and 2b may snap.

An object of the present invention is to provide an improved IC card, in which at least those IC's which are located in the rear portion of the card are not bonded to the adhesive layers so that the IC's may not be forced to move forward or rearward by the bending of the top and bottom panels which occurs when the IC card is bent as shown in FIG. 3, for example, whereby no stress is applied to the leads or the solder layers.

SUMMARY OF THE INVENTION

According to the present invention, an IC card includes, at portions of adhesive layers facing at least those IC's which are located in the rear portion of the IC card, means for preventing said IC's from adhering to panels via the adhesive layers. The means for preventing the adhesion comprises openings formed in the adhesive layers at portions facing the IC's. Alternatively, adhesion preventing sheets may be disposed between the adhesive layers and the IC's.

DESCRIPTION OF PREFERRED EMBODIMENTS

Now, the present invention is described in detail with reference to the accompanying drawings.

Figure 1:
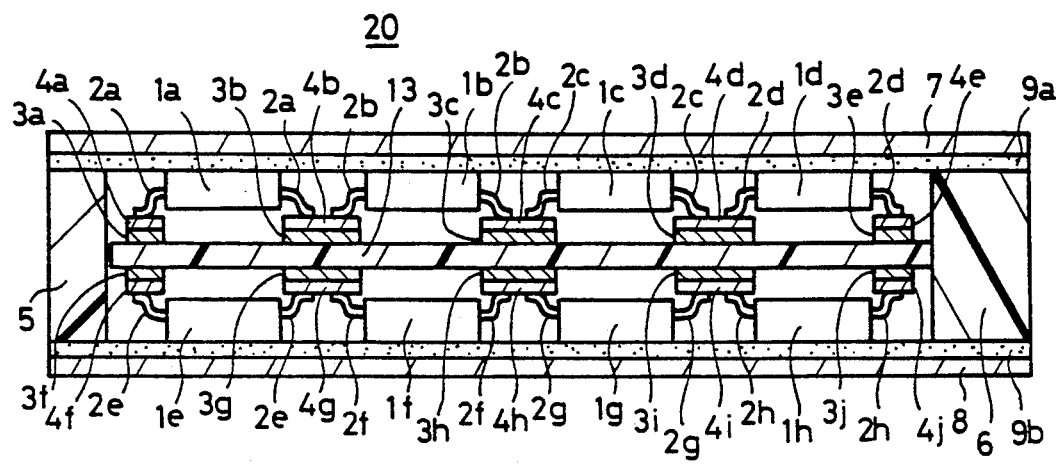
FIG. 1 is a cross-sectional view of a conventional IC card.
Figure 4:
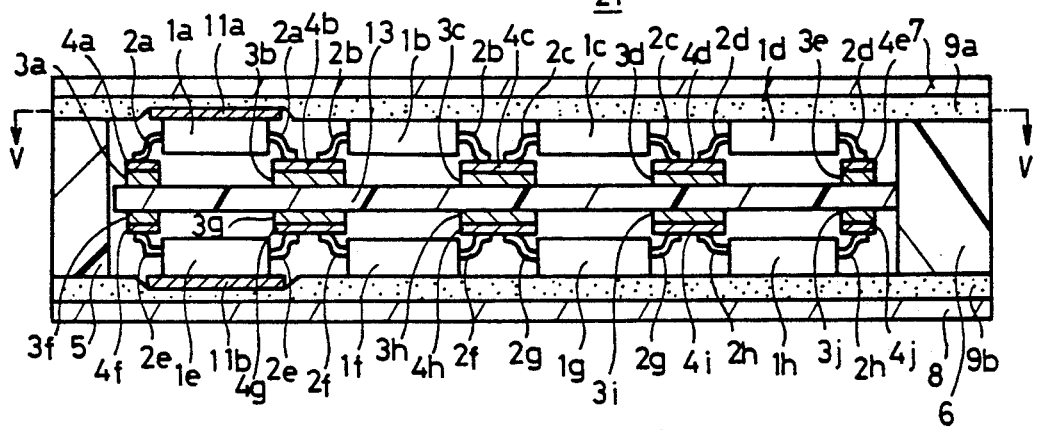
FIG. 4 is a cross-sectional view of an IC card according to a first embodiment of the present invention, in which adhesion preventing sheets are disposed between IC's and adhesive layers.
Figure 5:
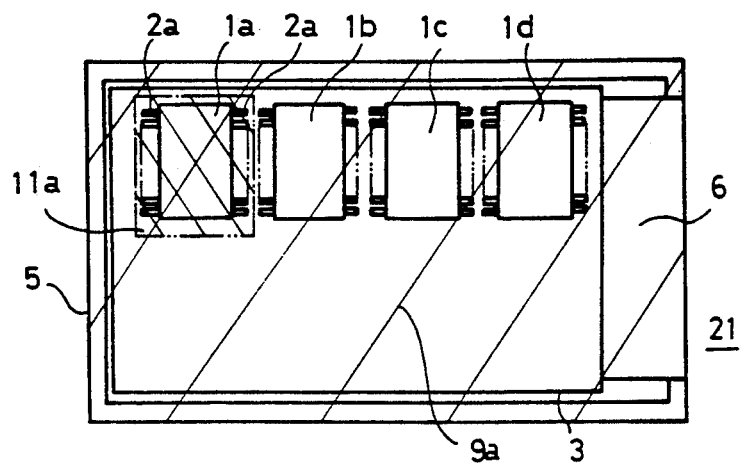
FIG. 5 is a reduced cross-sectional view taken along line V—V of FIG. 4.
Figure 6:
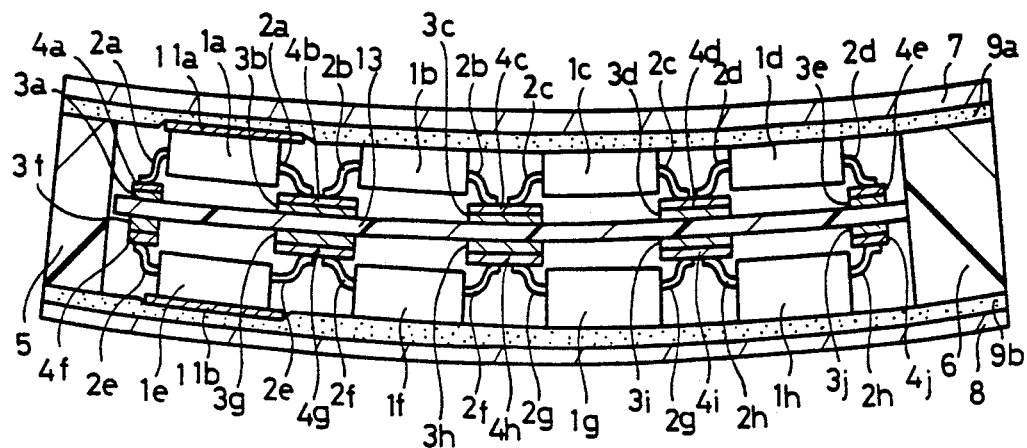
FIG. 6 is a cross-sectional view of the IC card of FIG. 4 when it is bent.

A first embodiment of the present invention is shown in FIGS. 4-6. The structure of an IC card 21 shown in FIGS. 4-6 is similar to that of the conventional IC card shown in FIG. 1, except that adhesion preventing sheets 11a and 11b are disposed between an IC 1a and an adhesive layer 9a and between an IC 1e and an adhesive layer 9b, respectively. Thus, the IC's 1a and 1e are prevented from being bonded to the adhesive layers.

Specifically, on the opposite major surfaces of the substrate 13, there are disposed lands 3a-3j which constitute part of the IC card circuit. Semiconductor devices, such as IC's 1a-1h, for storing or processing information, are mounted with their leads 2a-2h bonded to the associated lands 3a-3j by means of solder layers 4a-4j. Thus, the respective IC's are electrically and mechanically coupled to the major surfaces of the substrate 13. The substrate 13 with the IC's 1a-1h mounted thereon is disposed within a casing which comprises a frame 5 and top and bottom panels 7 and 8 which are bonded to the opposite sides of the frame 5 by means of respective adhesive layers 9a and 9b. As shown in FIG. 5, at one end of the frame 5, a connector 6 is disposed, which is used for connecting the IC card to an external device such as the device 10 shown in FIG. 2. The connector 6 is connected to the substrate 13 within the casing. As stated previously, the IC card 21 according to the first embodiment of the present invention employs the adhesion preventing sheets 11a and 11b disposed between the IC's 1a and 1e and the adhesive layers 9a and 9b, respectively, so that the IC's 1a and 1e which are located in the rear portion of the IC card 21 do not adhere to the adhesive layers 9a and 9b. The adhesive layers 9a and 9b are first disposed on the top and bottom panels 7 and 8, respectively, and, then, the adhesion preventing sheets 11a and 11b are disposed to adhere to the adhesive layers 9a and 9b at the locations facing the IC's 1a and 1b.

Figure 2:
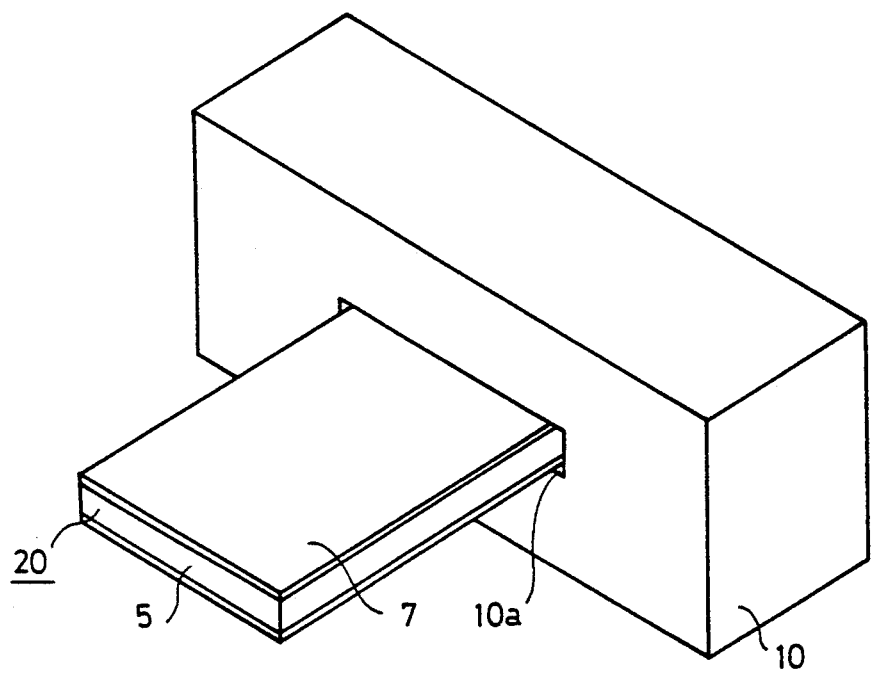
FIG. 2 is a perspective view of the IC card of FIG. 1 inserted into an external device.
Figure 3:
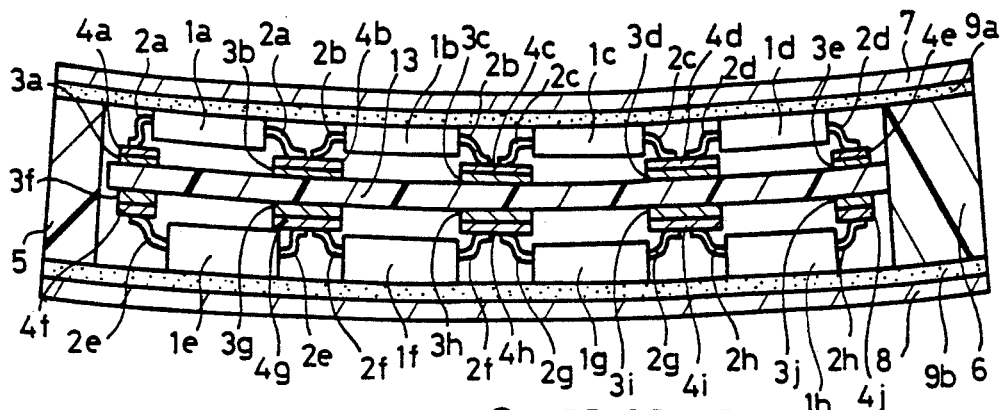
FIG. 3 is a cross-sectional view of the IC card of FIG. 1 when it is bent.

The IC card 21 with the above-described structure is inserted into or withdrawn from the external device 10, shown in FIG. 2, through the inlet port 10a when a user uses the IC card 21. When the IC card 21 is inserted into or withdrawn from the device 10, it may be bent as shown in FIG. 6. Since the adhesion preventing sheets 11a and 11b prevent the IC's 1a and 1e from being bonded to the panels 7 and 8, the bending of the panels 7 and 8 never forces the IC's 1a and 1e to move forward or rearward. Accordingly, no undesired stress is applied to any of the leads 2a and 2e or to any of the solder layers 4a, 4b, 4f and 4g. Thus, no fault, such as defective connection due to cracking of the solder layers and disconnection of the leads 2a and 2e, will occur.

In this first embodiment, adhesion preventing sheets are disposed only at those locations of the adhesive layers 9a and 9b which face the IC's 1a and 1e which would otherwise be displaced the most when the IC card 21 is bent as shown in FIG. 6. However, such adhesion preventing sheets may be disposed at all of the IC's 1a-1h. Thus, not only when the IC card is bent, as shown in FIG. 6, as it is inserted into or withdrawn from the external device 10, but also when the IC card is largely bent at any location on the IC card, no stress will be applied to the IC's, the leads, or the solder layers and, therefore, no fault, such as defective connection due to cracking of the solder layers and disconnection of the leads, will occur.

IC's may be disposed only on one surface of the substrate 13.

Figure 7:
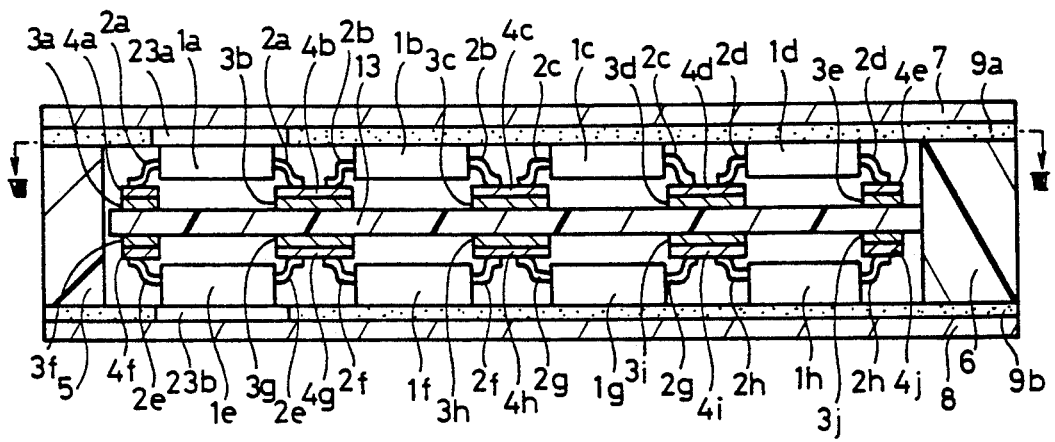
FIG. 7 is a cross-sectional view of an IC card according to a second embodiment of the present invention.
Figure 8:
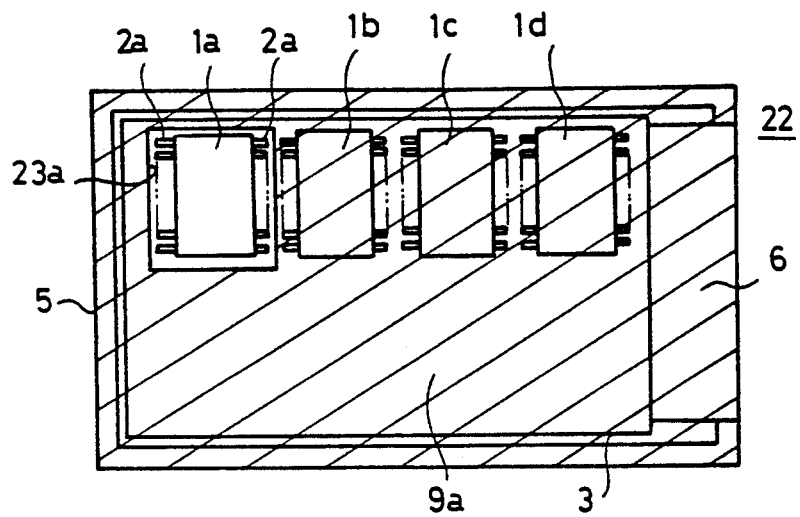
FIG. 8 is a reduced cross-sectional view taken along line VIII—VIII of FIG. 7.
Figure 9:
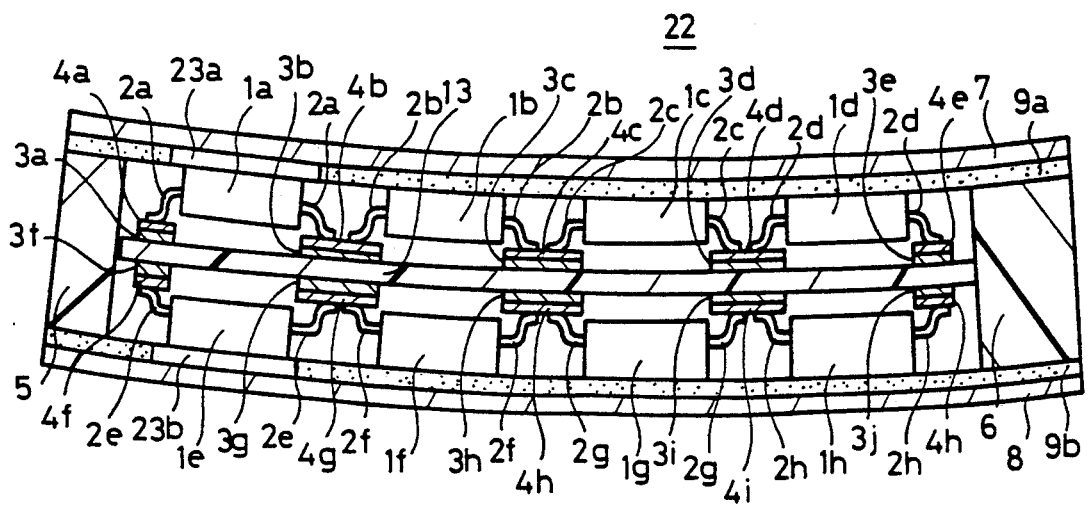
FIG. 9 is a cross-sectional view of the IC card of FIG. 8 when it is bent.

FIGS. 7, 8 and 9 show an IC card 22 according to a second embodiment of the present invention. In FIGS. 7, 8 and 9, elements similar or equivalent to those shown in FIGS. 4, 5 and 6 are designated by the same reference numerals, and their details are not described.

In the second embodiment, in order to prevent the IC's 1a and 1c from being bonded to the associated panels 7 and 8 via the adhesive layers 9a and 9b, openings 23a and 23b are formed in the adhesive layers 9a and 9b at those locations which face the IC's 1a and 1e. The openings 23a and 23b may be formed by removing the portions of the adhesive layers 9a and 9b before they are applied to the panels.

As in the IC card 21 of the first embodiment, even when the IC card 22 is bent, as shown in FIG. 9, as it is inserted into or withdrawn from the external device 10 shown in FIG. 2, the IC's 1a and 1e will not be forced to move forward or rearward by the panels 7 and 8, since they are separated from the panels 7 and 8 by the openings 23a and 23b Accordingly, no stress is applied to either the leads 2a and 2e of the IC's 1a and 1e or to the solder layers 4a, 4b, 4f and 4g which connect the leads to the lands. Therefore, faults, such as defective connection due to cracking of the solder layers and disconnection of the leads is avoided.

In the second embodiment, too, as in the first embodiment, openings like the ones 23a and 23b may be formed in the adhesive layers 9a and 9b for all of the IC's 1a-1h. Then, neither deformation of the IC card 22 when it is bent as shown in FIG. 9, as it is inserted into or withdrawn from the external device 10 shown in FIG. 2, nor other type of deformation which could occur during the handling of the IC card 22 causes any stress to be applied to the IC's, the leads or the solder layers.

In this second embodiment, too, IC's may be disposed only on one of the two major surfaces of the substrate 13.

In the described embodiments, the adhesive layers 9a and 9b are used, but adhesive sheets may be used in place of the adhesive layers.

As described in detail above, according to the present invention, at least those IC's which are located in the rear part of an IC card are prevented from adhering to panels of the card via adhesive layers. Accordingly, even if the panels or a frame are more or less deformed during the use or handling of the card, none of the IC's, the leads and the solder layers connecting the leads to the substrate within the casing of the IC card are stressed and, therefore, faults, such as disconnection of the leads and cracking of the solder layers, are avoided. Thus, according to the present invention, highly reliable, high quality IC cards are produced.

What is claimed is:

1. An IC card comprising a substrate having two opposing major surfaces, a plurality of semiconductor devices mounted on at least one of said major surfaces of said substrate, and a casing housing said substrate with said semiconductor devices mounted thereon, said casing comprising a frame having opposed sides, opposed front and rear ends, an electrical connector disposed at the front end, two panels, each panel having an inside surface and an outside surface, and an adhesive layer disposed over the inside surface of each of said panels, each of the adhesive layers bonding one of said panels to respective opposite sides of said frame including adhesion preventing means for preventing only those semiconductor devices mounted proximate the rear end from adhering to said adhesive layers, said adhesion preventing means being disposed between said panels and those semiconductor devices mounted proximate the rear end whereby forces bending said IC card are not transmitted to those semiconductor devices mounted proximate the rear end adjacent to said adhesion preventing means.

2. An IC card according to claim 1 wherein semiconductor devices are mounted on both of the major surfaces of said substrate.

3. An IC card having opposed front and rear ends comprising a substrate having two opposing major surfaces, a plurality of semiconductor devices mounted on at least one of said major surfaces of said substrate, an electrical connector disposed at the front end of said IC card, and a casing housing said substrate with said semiconductor devices mounted thereon, said casing comprising a frame having opposed sides, two panels, each panel having an inside surface and an outside surface, and an adhesive layer disposed over the inside surface of each of said panels, the adhesive layers bonding said panels to respective opposite sides of said frame and including adhesion preventing sheets for preventing at least some of said semiconductor devices from adhering to said adhesive layers, said sheets being bonded to said adhesive layers only at those semiconductor devices mounted proximate the rear end of said IC card and disposed in contact with at least some of said semiconductor devices whereby forces bending said IC card are not transmitted to said semiconductor devices adjacent to said adhesion preventing sheets.

4. An IC card according to claim 3 wherein semiconductor devices are mounted on both of the major surfaces of said substrate.

5. An IC card comprising a substrate having two opposing major surfaces, a plurality of semiconductor devices mounted on at least one of said major surfaces of said substrate, and a casing housing said substrate with said semiconductor devices mounted thereon, said casing comprising a frame having opposed sides, opposed front and rear ends, an electrical connector disposed at the front end, two panels, each panel having an inside surface and an outside surface, and an adhesive layer disposed over the inside surface of each of said panels, the adhesive layers bonding said panels to respective opposite sides of said frame including openings in said adhesive layers for preventing only those semiconductor devices mounted proximate the rear end from adhering to said adhesive layers, said openings being formed in said adhesive layers opposite those semiconductor devices mounted proximate the rear end whereby forces bending said IC card are not transmitted to those semiconductor devices mounted proximate the rear end adjacent to said adhesion preventing openings.

6. An IC card according to claim 5 wherein semiconductor devices are mounted on both of the major surfaces of said substrate.

* * * * *